United States Patent
Lee

(10) Patent No.: US 8,901,984 B1
(45) Date of Patent: Dec. 2, 2014

(54) DIRECT CURRENT OFFSET CORRECTION CIRCUIT

(71) Applicant: Hon Hai Precision Industry Co., Ltd., New Taipei (TW)

(72) Inventor: Yang-Han Lee, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 14/029,818

(22) Filed: Sep. 18, 2013

(30) Foreign Application Priority Data

Jun. 27, 2013 (CN) .................. 2013 1 02626301

(51) Int. Cl.
*H04L 25/06* (2006.01)
*H03K 17/16* (2006.01)
*H04B 15/00* (2006.01)
*H03K 5/007* (2006.01)

(52) U.S. Cl.
CPC ...................... *H03K 5/007* (2013.01)
USPC ......................... 327/307; 330/290

(58) Field of Classification Search
None
See application file for complete search history.

(56) References Cited

U.S. PATENT DOCUMENTS

| | | | | |
|---|---|---|---|---|
| 5,539,779 | A * | 7/1996 | Nagahori | 375/317 |
| 6,016,067 | A | 1/2000 | Vulih et al. | |
| 6,426,663 | B1 * | 7/2002 | Manlove et al. | 327/307 |
| 6,690,225 | B2 * | 2/2004 | Kondo et al. | 327/307 |
| 7,233,164 | B2 * | 6/2007 | Stojanovic et al. | 326/22 |
| 7,271,649 | B2 * | 9/2007 | Chiu et al. | 330/9 |
| 7,924,088 | B1 * | 4/2011 | Chiang et al. | 330/9 |
| 8,126,087 | B2 * | 2/2012 | Han et al. | 375/319 |
| 2012/0044006 | A1 * | 2/2012 | Kao et al. | 327/307 |

* cited by examiner

*Primary Examiner* — Lincoln Donovan
*Assistant Examiner* — Terry L Englund
(74) *Attorney, Agent, or Firm* — Novak Druce Connolly Bove + Quigg LLP

(57) ABSTRACT

A direct current offset correction circuit includes an obtaining module, a controller, and a correction module. The obtaining module obtains a DC offset voltage from an output of a target circuit. The controller is connected to the obtaining module, and the controller outputs correction signals in response to the direct current offset voltage being greater than a predetermined voltage. The correction module is connected to the target circuit, the obtaining module, and the controller. The correction module compensates the direct current offset voltage of the target circuit according to the correction signals.

9 Claims, 3 Drawing Sheets

DIRECT CURRENT OFFSET CORRECTION CIRCUIT

BACKGROUND

1. Technical Field

The disclosure relates to correction circuits, and particularly to a direct current (DC) offset correction circuit.

2. Description of Related Art

In digital communication systems, a DC offset is often mixed in with received signals. This causes the received signals to be distorted by the DC offset, thereby leading to inaccurate data decoding. Therefore, there is a need for a digital communication system that can overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one."

Figure 1:
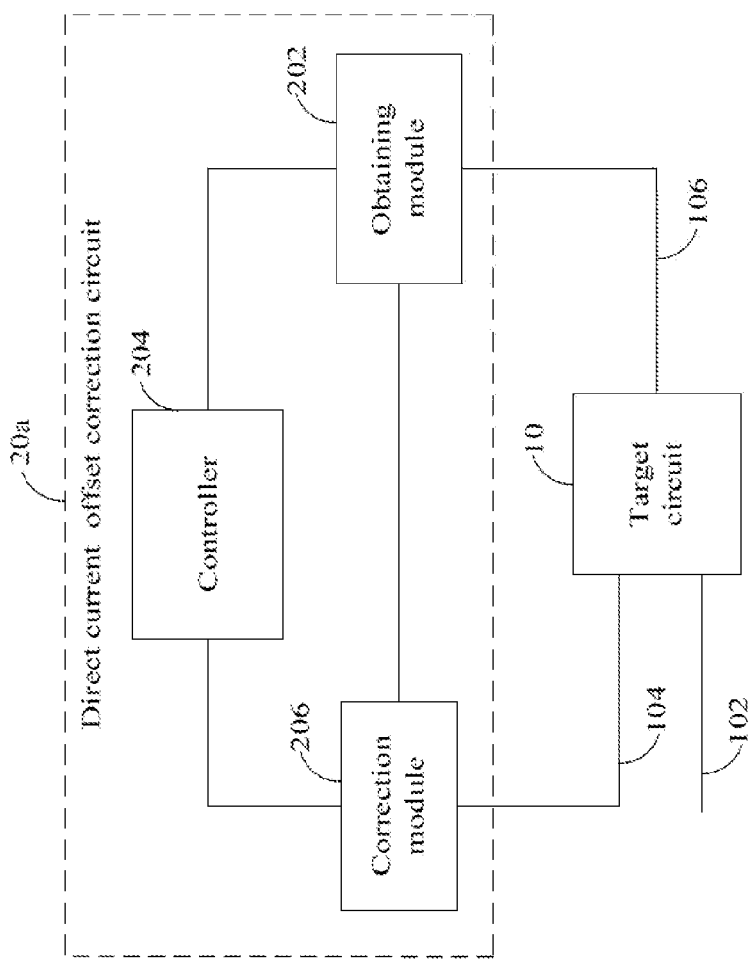
FIG. 1 is a schematic diagram of a first embodiment of a direct current offset correction circuit 20a according to the present disclosure.

FIG. 1 is a schematic diagram of a first embodiment of a direct current offset correction circuit 20a according to the present disclosure. In this embodiment, the DC offset correction circuit 20a is connected to a target circuit 10 having a DC offset. The target circuit 10 can be a frequency mixing system, a frequency independent system, or a multistage amplifier, for example.

In this embodiment, the target circuit 10 comprises a signal input 102 receiving external signals, a feedback input 104 receiving feedback signals, and an output 106.

In this embodiment, the DC offset correction circuit 20a comprises an obtaining module 202, a controller 204, and a correction module 206. The obtaining module 202 obtains a DC offset voltage from the output 106 of the target circuit 10, and sends the DC offset voltage to the controller 204 and the correction module 206.

The controller 204 is connected to the obtaining module 202. The controller 204 compares the obtained DC offset voltage with a predetermined voltage, and outputs correction signals to the correction module 206 if the obtained DC voltage is greater than the predetermined voltage. The correction signals are used to notify the correction module 206 to compensate the DC offset voltage of the target circuit 10.

The correction module 206 is connected to the target circuit 10, the obtaining module 202, and the controller 204. The correction module 206 compensates the DC offset voltage of the target circuit 10 according to the correction signals.

The predetermined voltage is determined by a need of the target circuit 10. In this embodiment, the predetermined voltage is 50 microvolts. In response to the DC offset voltage being greater than 50 microvolts, the controller 204 outputs the correction signals to the correction module 206 to control the correction module 206 to compensate the DC offset voltage of the target circuit 10.

Figure 2:
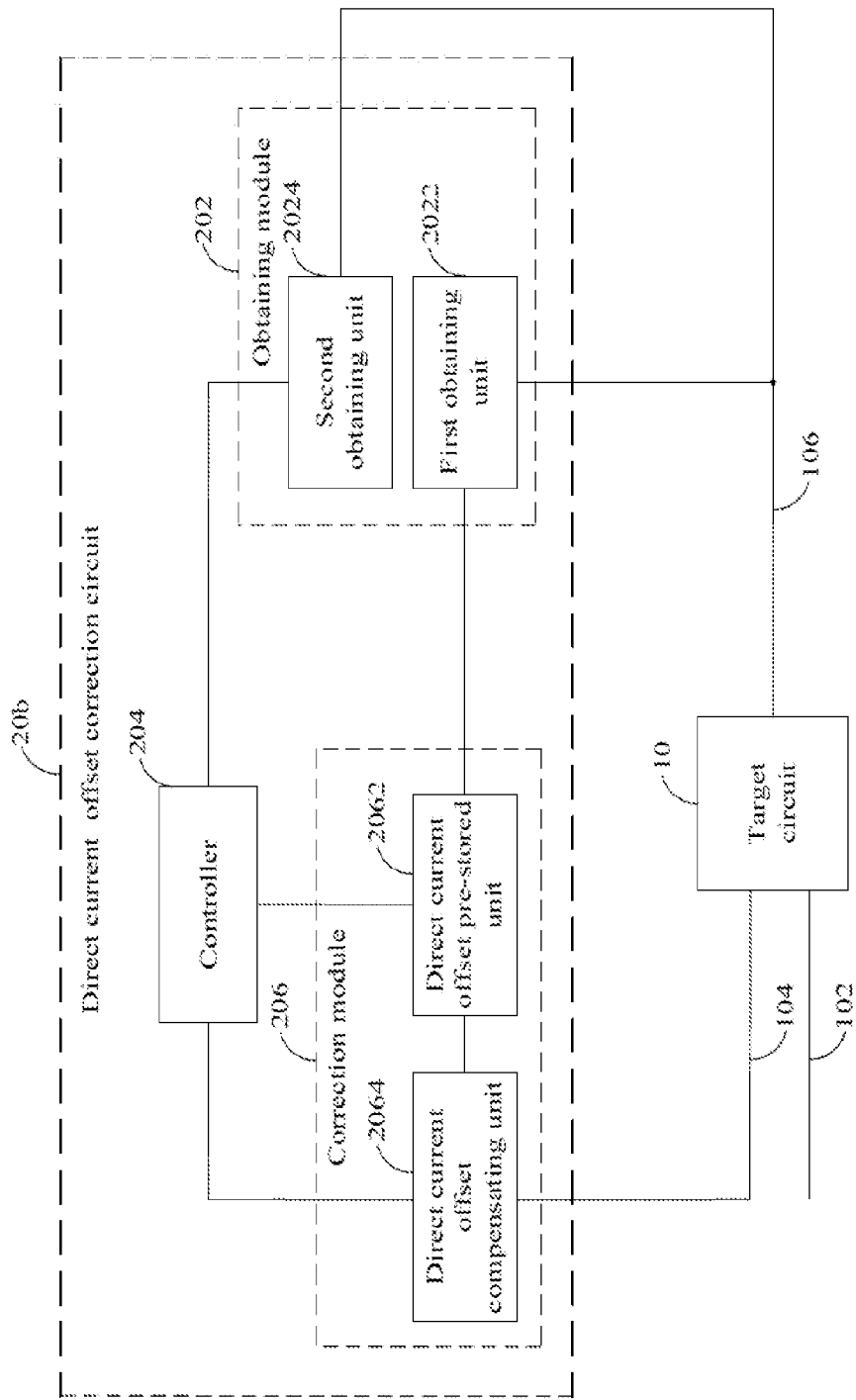
FIG. 2 is a schematic diagram of a second embodiment of a DC offset correction circuit 20b according to the present disclosure.

FIG. 2 is a schematic diagram of a second embodiment of a DC offset correction circuit 20b according to the present disclosure. In this embodiment, the obtaining module 202 further comprises a first obtaining unit 2022 and a second obtaining unit 2024, and the correction module 206 further comprises a DC offset pre-stored unit 2062 and a DC offset compensating unit 2064.

In this embodiment, the first obtaining unit 2022 is connected to the target circuit 10 and the correction module 206. The first obtaining unit 2022 obtains the DC offset voltage from the output 106 of the target circuit 10 and sends the DC offset voltage to the correction module 206. The second obtaining unit 2024 is connected to the target circuit 10 and the controller 204. The second obtaining unit 2024 obtains the DC offset voltage from the output 106 of the target circuit 10 and sends the DC offset voltage to the controller 204.

The DC offset pre-stored unit 2062 stores the DC offset voltage of the first obtaining unit 2022 according to the correction signals output by the controller 204. The DC offset compensating unit 2064 compensates the stored DC offset voltage according to the correction signals output by the controller 204.

Figure 3:
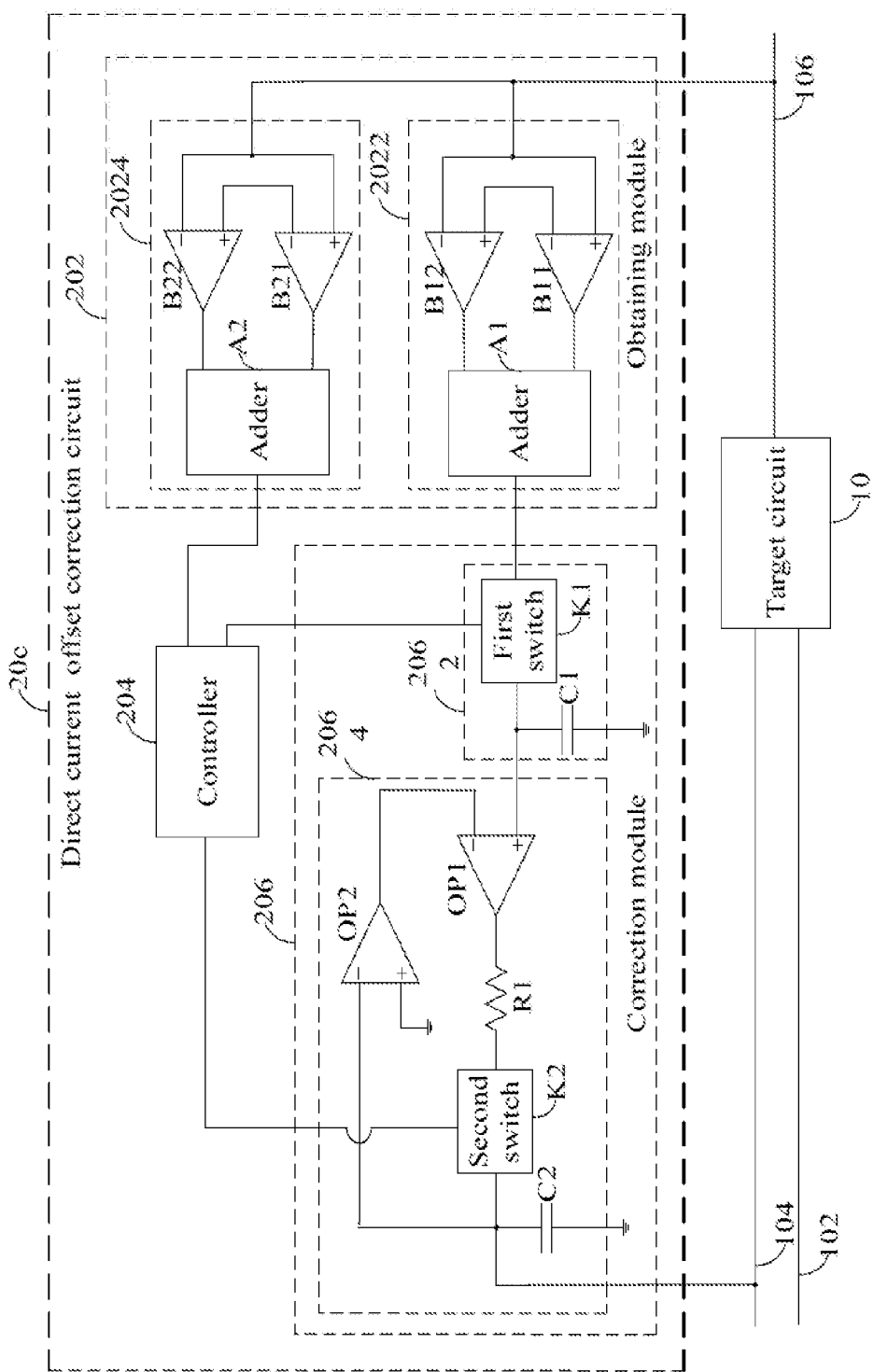
FIG. 3 is a circuit diagram of a third embodiment of a DC offset correction circuit 20c according to the present disclosure.

FIG. 3 is a circuit diagram of a third embodiment of a DC offset correction circuit 20c. In this embodiment, the DC offset correction circuit 20c is similar to the DC offset correction circuit 20b of the second embodiment. The first obtaining unit 2022 is similar to the second obtaining unit 2024, and the first obtaining unit 2022 and the second obtaining unit 2024 do the same thing.

In this embodiment, the first obtaining unit 2022 comprises a first buffer B11, a second buffer B12, and an adder A1. The first buffer B11 stores a first sum of a voltage of an output signal of the output 106 and the DC offset voltage of the output 106. The second buffer B12 stores a second sum of the opposite voltage of the output signal of the output 106 and the DC offset voltage of the output 106. The adder A1 doubles the DC offset voltage by adding the first sum and the second sun. Thus, the first obtaining unit 2022 and the second obtaining unit 2024 get twice the DC offset voltage.

In other embodiments, the first obtaining unit 2022 and the second obtaining unit 2024 can get one DC offset voltage by other circuits. The first obtaining unit 2022 sends the one DC-offset voltage to the correction module 206, and the second obtaining unit 2024 sends the one DC-offset voltage to the controller 204.

In this embodiment, the controller 204 receives twice the DC offset voltage from the second obtaining unit 2024 and determines if twice the DC offset voltage is greater than the predetermined voltage. In response to twice the DC offset voltage being greater than the predetermined voltage, the controller 204 outputs the correction signals.

The controller can be a single chip microcomputer (SCM), a microcontroller (MCU), a programmable logic device (PLD), a complex programmable logic device (CPLD), or a field programmable gate array (FPGA), for example.

In this embodiment, to ensure a fast correction of the DC offset voltage output by the target circuit 10, the obtaining module 202 comprises the first obtaining unit 2022 and the second obtaining unit 2024 to obtain the DC offset voltage at the same time. In other embodiments, the obtaining module 202 can comprise one obtaining unit to obtain the DC offset voltage and send the DC offset voltage to the controller 204 and the correction module 206.

In this embodiment, the DC offset pre-stored unit 2062 comprises a first switch K1 and a first capacitor C1. The DC offset compensating unit 2064 comprises a second switch K2, a resistor R1, a second capacitor C2, a first amplifier OP1, and a second amplifier OP2. A first terminal of the first switch K1 is connected to the first obtaining unit 2022, and a control terminal of the first switch K1 is connected to the controller 204. A first end of the first capacitor C1 is connected to a second terminal of the first switch K1, and a second end of the first capacitor C1 is grounded. A non-inverting input of the first amplifier OP1 is connected to a node between the first switch K1 and the first capacitor C1. A first end of the resistor R1 is connected to an output of the first amplifier OP1. A first terminal of the second switch K2 is connected to a second end of the resistor R1, and a control terminal of the second switch K2 is connected to the controller 204. A first end of the second capacitor C2 is connected to a second terminal of the second switch K2 and the feedback input 104 of the target circuit 10, and a second end of the second capacitor C2 is grounded. A non-inverting input of the second amplifier OP2 is grounded, and an inverting input of the second amplifier OP2 is connected to the first end of the second capacitor C2, the second terminal of the second switch K2, and the feedback input 104 of the target circuit 10. An output of the second amplifier OP2 is connected to an inverting input of the first amplifier OP1.

In this embodiment, the correction module 206 compensates the DC offset voltage of the output 106 of the target circuit 10. That is, the correction module 206 makes the electric charge of the first capacitor C1 equivalent to the electric charge of the second capacitor C2 to reduce the DC offset voltage of the output 106 of the target circuit 10.

In this embodiment, the correction signals output by the controller 204 control the first switch K1 and the second switch K2 to alternately turn on and turn off. For example, in response to turning on the first switch K1, the second switch K2 is turned off, and in response to turning on the second switch K2, the first switch K1 is turned off. In response to the controller 204 controlling the first switch K1 to turn on, the second switch K2 is turned off, and the first capacitor C1 is charged by the DC offset voltage of the first obtaining unit 2022. The first obtaining unit 2022 charges twice the DC offset voltage output by the target circuit 10 in the first capacitor C1 via the first switch K1. In response to the controller 204 controlling the second switch K2 to turn on, the first switch K1 is turned off. Electric charge of the first capacitor C1 is the DC offset voltage output by the first obtaining unit 2022, and electric charge of the second capacitor C2 is a voltage of the feedback signals of the feedback input 104 of the target circuit 10. In response to the electric charge of the first capacitor C1 being greater than the electric charge of the second capacitor C2, the first capacitor C1 is discharged, and the second capacitor C2 is charged. In response to the electric charge of the first capacitor C1 being less than the electric charge of the second capacitor C2, the first capacitor C1 is charged, and the second capacitor C2 is discharged. The correction module 206 makes the electric charge of the first capacitor C1 equivalent to the electric charge of the second capacitor C2 to reduce the DC offset voltage of the output 106 of the target circuit 10.

In this embodiment, in response to the electric charge of the first capacitor C1 being equivalent to the electric charge of the second capacitor C2, the controller 204 controls the first switch K1 and the second switch K2 to turn off to finish compensation. If the DC offset voltage output by the obtaining module 202 becomes greater than the predetermined voltage of the controller 204 again, the DC offset correction circuit 20c works as the steps mentioned-above. The second capacitor C2 is charged or discharged via linear components to reduce correction time of the correction module 206.

The DC offset correction circuit 20c takes about 0.115 microseconds to compensate a 50 microvolt DC-offset voltage. A low-pass filter takes about 7 microseconds, in one example. Therefore, the DC offset correction circuit 20a, 20b, 20c is faster than the low-pass filter.

The foregoing disclosure of various embodiments has been presented for the purposes of illustration. It is not intended to be exhaustive or to limit the invention to the precise forms disclosed. Many variations and modifications of the embodiments described herein will be apparent to one of ordinary skill in the art in the light of the above disclosure. The scope of the invention is to be defined only by the claims appended hereto and their equivalents.

What is claimed is:

1. A direct current (DC) offset correction circuit for a target circuit, the target circuit comprising an output and a feedback input, the DC offset correction circuit connected between the output and the feedback input, and the DC offset correction circuit comprising:
    an obtaining module obtaining a DC offset voltage from the output of the target circuit;
    a controller connected to the obtaining module, the controller outputting correction signals in response to the direct current offset voltage being greater than a predetermined voltage; and
    a correction module connected to the target circuit, the obtaining module and the controller, the correction module compensating the DC offset voltage of the target circuit according to the correction signals;
    wherein the obtaining module comprises a first obtaining unit and a second obtaining unit, the first obtaining unit is connected to the target circuit and the correction module, the first obtaining unit obtains the DC offset voltage from the output of the target circuit and sends the DC offset voltage to the correction module, the second obtaining unit is connected to the target circuit and the controller, the second obtaining unit obtains the DC offset voltage from the output of the target circuit and sends the DC offset voltage to the controller.

2. The DC offset correction circuit of claim 1, wherein each of the first obtaining unit and the second obtaining unit comprises a first buffer, a second buffer, and an adder; the first buffer stores a first sum of an voltage of an output signal of the output of the target circuit and the DC offset voltage of the output of the target circuit, the second buffer stores a second sum of an opposite voltage of the output signal of the output of the target circuit and the DC offset voltage of the output of the target circuit, the adder doubles the DC offset voltage by adding the first sum and the second sum.

3. The DC offset correction circuit of claim 1, wherein the correction module comprises:
    a DC offset pre-stored unit storing the DC offset voltage of the obtaining module according to the correction signals; and
    a DC offset compensating unit compensating the stored DC offset voltage according to the correction signals.

4. The DC offset correction circuit of claim 3, wherein the DC offset pre-stored unit comprises:
- a first switch with a first terminal connected to the obtaining module, and a control terminal connected to the controller; and
- a first capacitor with a first end connected to a second terminal of the first switch, and a second end grounded.

5. The DC offset correction circuit of claim 4, wherein the DC offset compensating unit comprises:
- a first amplifier with a non-inverting input connected to the DC offset pre-stored unit;
- a resistor with a first end connected to an output of the first amplifier;
- a second switch with a first terminal connected to a second end of the resistor, and a control terminal connected to the controller;
- a second capacitor with a first end connected to a second terminal of the second switch and the feedback input of the target circuit, and a second end grounded; and
- a second amplifier with a non-inverting input grounded, an inverting input connected to the first end of the second capacitor, and an output connected to an inverting input of the first amplifier.

6. The DC offset correction circuit of claim 5, wherein the correction signals are used to control the first switch and the second switch to alternatively turn on and off.

7. The DC offset correction circuit of claim 6, wherein the first capacitor is charged to store the DC offset voltage in response to turning on the first switch.

8. The DC offset correction circuit of claim 6, wherein the first capacitor is charged to compensate the DC offset voltage of the target circuit in response to turning on the second switch.

9. The DC offset correction circuit of claim 6, wherein the first capacitor is discharged to compensate the DC offset voltage of the target circuit in response to turning on the second switch.

* * * * *